US010663486B2

(12) United States Patent
Cocchini et al.

(10) Patent No.: US 10,663,486 B2
(45) Date of Patent: May 26, 2020

(54) PORTABLE ELECTRICAL NOISE PROBE STRUCTURE

(71) Applicant: International Business Machines Corporation, Armonk, NY (US)

(72) Inventors: Matteo Cocchini, Long Island, NY (US); Michael A. Cracraft, Poughkeepsie, NY (US); Khaalid P. J. McMillan, Wappingers Falls, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 500 days.

(21) Appl. No.: 15/425,042

(22) Filed: Feb. 6, 2017

(65) Prior Publication Data
US 2018/0224480 A1    Aug. 9, 2018

(51) Int. Cl.
*G01R 1/067* (2006.01)
*G01R 1/073* (2006.01)

(52) U.S. Cl.
CPC ..... *G01R 1/06733* (2013.01); *G01R 1/07364* (2013.01); *G01R 1/06772* (2013.01)

(58) Field of Classification Search
CPC ............. G01R 1/067; G01R 1/06733; G01R 1/06711; G01R 1/06738; G01R 1/06772; G01R 1/073; G01R 1/07314; G01R 1/07328; G01R 1/07335
USPC ....... 324/149, 755.01, 755.02, 755.03, 755.1
See application file for complete search history.

(56) References Cited

U.S. PATENT DOCUMENTS

| 3,805,159 | A | * | 4/1974 | Richelmann | G01R 1/073 324/755.05 |
| 4,473,798 | A | * | 9/1984 | Cedrone | G01R 1/0466 307/89 |
| 4,498,047 | A | * | 2/1985 | Hexamer | G01R 31/2886 324/750.19 |
| 4,699,593 | A | | 10/1987 | Grabbe et al. | |
| 4,912,400 | A | | 3/1990 | Plante | |
| 4,970,460 | A | * | 11/1990 | Jensen | G01R 1/045 324/750.25 |
| 5,218,293 | A | * | 6/1993 | Kan | G01R 1/06772 324/754.14 |
| 5,506,510 | A | | 4/1996 | Blumenau | |
| 6,062,879 | A | | 5/2000 | Beaman et al. | |

(Continued)

OTHER PUBLICATIONS

Ardent Concepts, "IC Footprint Probe 16+2", http://www.ardentconcepts.com/shop/cable-assemblies/ic-footprint-probe-16x2-2/, Accessed on Jan. 30, 2017, 3 pages.

(Continued)

*Primary Examiner* — Steven L Yeninas
(74) *Attorney, Agent, or Firm* — Scully, Scott, Murphy & Presser, P.C.; Tihon Poltavets, Esq.

(57) ABSTRACT

An apparatus includes a carrier base and one or more contact elements coupled to a portion of the carrier base. The one or more contact elements are configured to sense an electrical signal flowing through at least one electrical component in a circuitry under test. The first contact element of the one or more contact elements comprises a power sense conductor extending from a bottom surface of the first contact element toward a top surface of the first contact element and a ground conductor electrically isolated from the power sense conductor.

10 Claims, 12 Drawing Sheets

(56) References Cited

U.S. PATENT DOCUMENTS

| | | |
|---|---|---|
| 6,551,126 B1* | 4/2003 | Feldman ............ G01R 1/06772 |
| | | 324/755.05 |
| 7,132,839 B2 | 11/2006 | Zaerpoor |
| 8,232,818 B2 | 7/2012 | Desta et al. |
| 8,305,101 B2 | 11/2012 | Desta et al. |
| 8,604,820 B2 | 12/2013 | Suto |
| 9,261,535 B2 | 2/2016 | Jakobson |
| 9,347,982 B1 | 5/2016 | Vinther et al. |
| 2005/0266733 A1* | 12/2005 | Martin ............... G01R 1/06711 |
| | | 439/695 |
| 2013/0002284 A1* | 1/2013 | Deutinger .......... G01R 1/06772 |
| | | 324/755.01 |
| 2015/0028911 A1* | 1/2015 | Chang ............... G01R 1/06772 |
| | | 324/756.03 |
| 2016/0187378 A1* | 6/2016 | Nagata ................ G01R 1/0408 |
| 2017/0227580 A1* | 8/2017 | Fang .................. G01R 1/07314 |

OTHER PUBLICATIONS

ASME, "Video: Integrating Electronics with 3D Printing", https://www.asme.org/engineering-topics/media/manufacturing-design/video-integrating-electronics-3d-printing, Feb. 2016, Accessed on Feb. 3, 2017, 14 pages.

\* cited by examiner

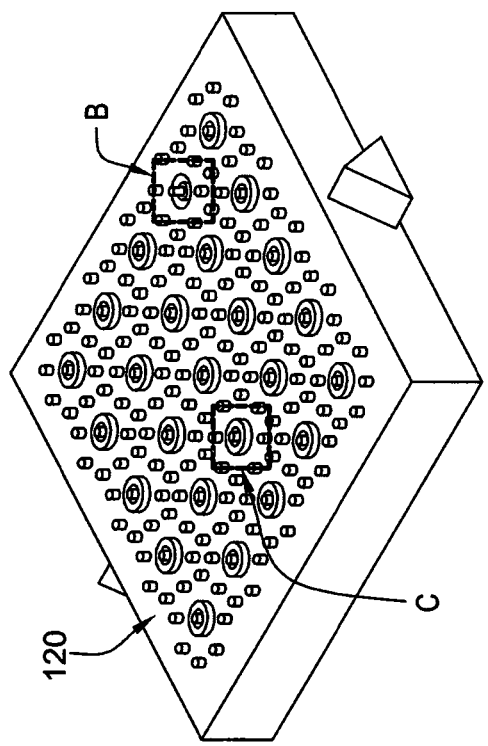
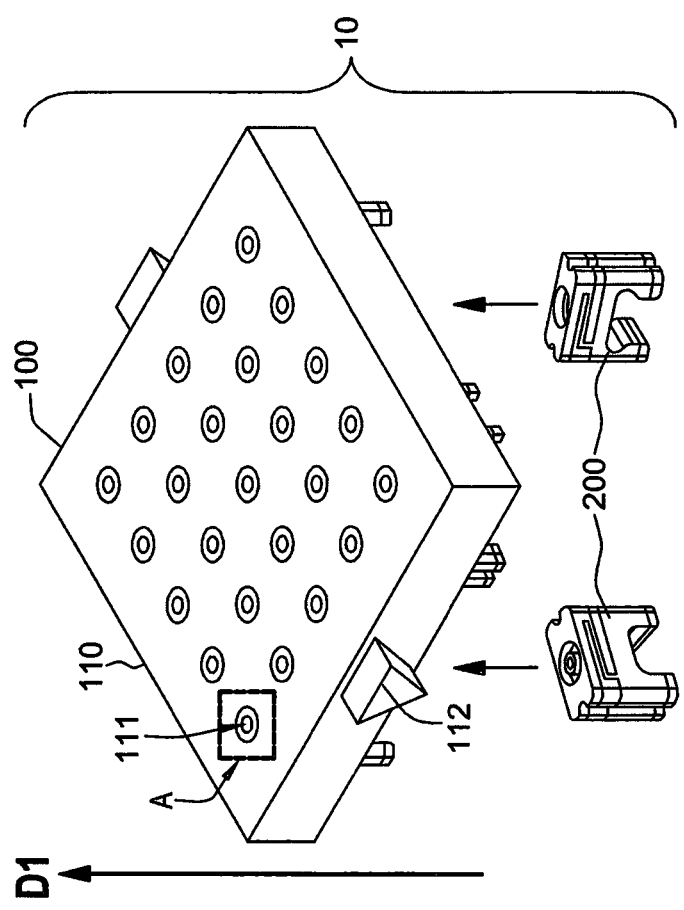
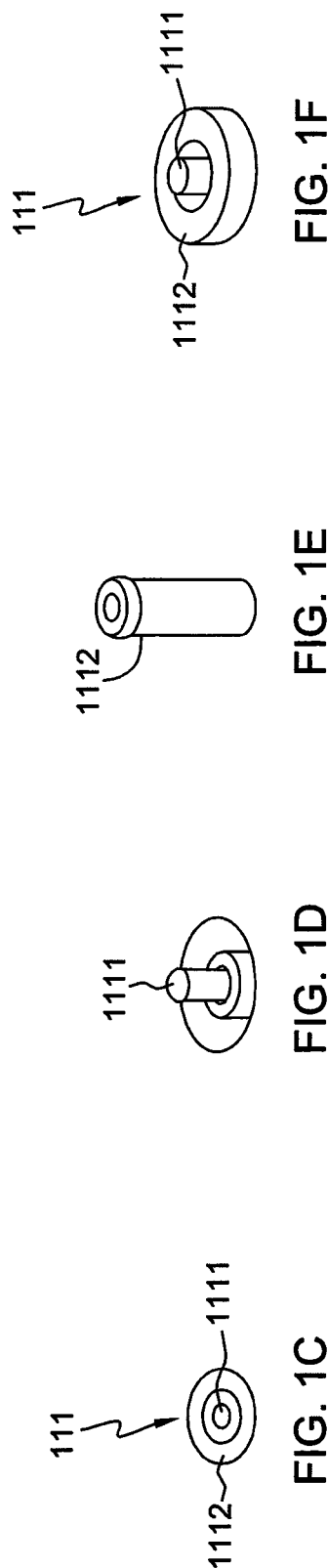

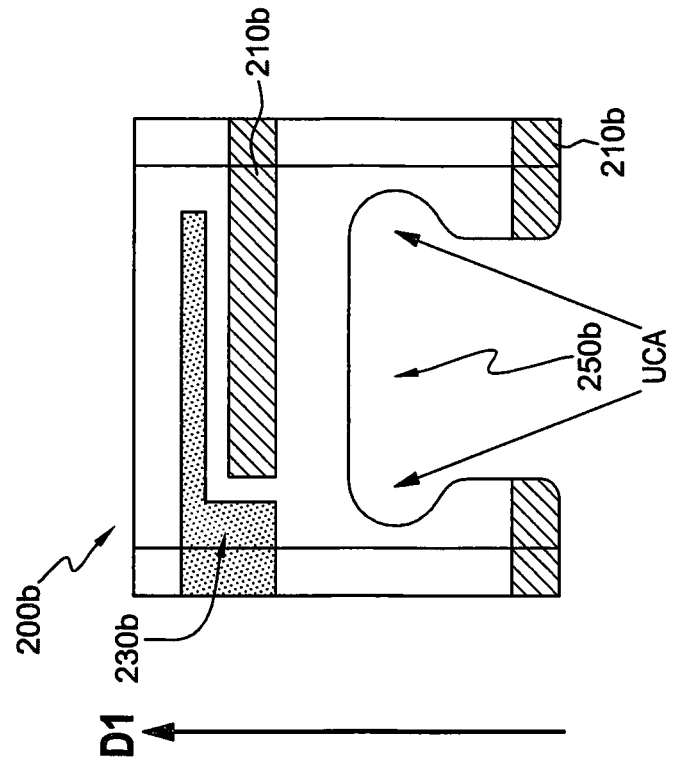
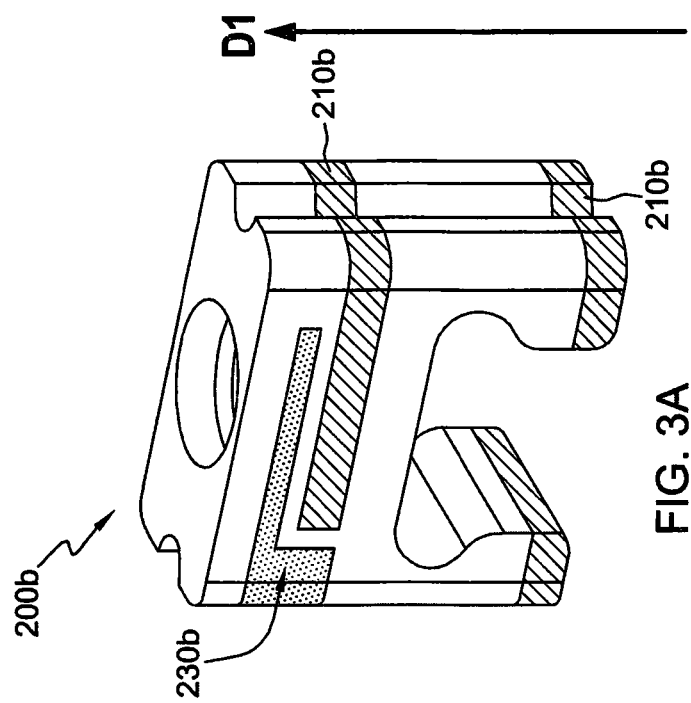
FIG. 3B
FIG. 3A

120
PORTABLE ELECTRICAL NOISE PROBE STRUCTURE

FIELD

The present disclosure relates to a probing apparatus and method for sensing electrical signals on an integrated circuit (IC) package.

BACKGROUND

In developing an IC package, electrical signals such as AC noise, DC drops, etc. need to be measured across multiple probing points under the IC package. Generally, most of these measurements may require an individual soldering of wires and a mechanical support to hold or stabilize a probe for the measurement. However, the soldering may be time-consuming and may increase a risk of short-circuit in the IC package under test.

Given that the measurements of the electrical signals across the probing points under the IC package may be performed while a measurement setup is running, a mechanical opening for accessing the probing points may be limited in size since a large opening may affect electrical properties of the environment and allow potential electromagnetic interferences (EMI) from external sources hence to alter the measurements themselves. Therefore, it is challenging to reach a correct probe point due to lack of a clear view of a probe point of interest.

In addition, an "Ardent Concepts" has been developed to provide a multi-port probing solution for accessing a featureless structure such as a back side of a pin array with no electrical components. However, the existing Ardent solution does not properly address issues of probing specific type of electrical components, such as surface-mounted technology (SMT)-based components (hereinafter, referred to as SMT components). Also, the Ardent solution is customizable from a supplier, and thus cannot be adapted to a variety of probing environments. The Ardent solution employs a base plate and probes. Since the probes in the Ardent solution shares a common reference (or ground) structure within the base plate, independent deployments of the probes would be limited.

SUMMARY

In an aspect of the present disclosure, an apparatus for sensing an electrical signal generated in a circuitry under test is provided. The apparatus includes a carrier base and one or more contact elements. The one or more contact elements are coupled to a portion of the carrier base and configured to sense the electrical signal flowing through at least one electrical component in the circuitry under test. A first contact element of the one or more contact elements includes a power sense conductor extending from a bottom surface of the first contact element toward a top surface of the first contact element and a ground conductor electrically isolated from the power sense conductor.

In another aspect of the present disclosure, an apparatus for sensing an electrical signal generated in a circuitry under test is provided. The apparatus includes one or more contact elements including a first contact element, a carrier base, and a fan-out assembly. The first contact element has a power sense conductor extending from a bottom surface of the first contact element toward a top surface of the first contact element. The carrier base has one or more conductors, each of which extends from a bottom surface of the carrier base toward a top surface of the carrier base. One end of the first contact element is connected to one end of a corresponding one of the one or more conductors of the carrier base. The fan-out assembly includes one or more conducting lines, each of the one or more conducting lines is connected to another end of the corresponding one of the one or more conductors of the carrier base. The first contact element is configured to face at least one electrical component in the circuitry under test and sense an electrical signal flowing through the at least one electrical component. The carrier base is configured to transfer the electrical signal sensed by the first element to the fan-out assembly. The fan-out assembly is configured to transfer the electrical signal transferred from the carrier base to a measurement instrument.

BRIEF DESCRIPTION OF THE DRAWINGS

FIGS. 1A to 1F depict diagrams of an example probing apparatus according to an exemplary embodiment of the present disclosure;

FIGS. 3A and 3B are various views of an example contact element according to an exemplary embodiment of the present disclosure;

DETAILED DESCRIPTION OF THE EMBODIMENTS

Figure 2B:
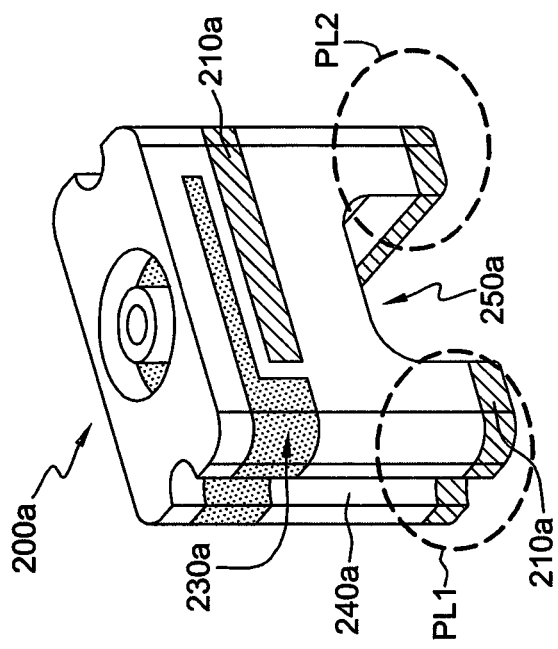
FIGS. 2A-2C depict various views of an example contact element according to an exemplary embodiment of the present disclosure.

Embodiments of the present invention will now be described in detail on the basis of the drawings. However, the following embodiments do not restrict the invention claimed in the claims. Moreover, all combinations of features described in the embodiments are not necessarily mandatory for the architecture of the present invention like numbers are assigned to like elements throughout the description of the embodiments of the present invention.

A probing apparatus or method according to the present disclosure provides simplified electrical signal (e.g., AC noise and DC drop) measurements at electrical components for a circuitry under test. In the context of the present disclosure, the term "circuitry under test (CUT)" may be understood to include, but are not limited to: an IC package, a printed-circuit board (PCB) including the IC package, and a card assembly including the IC package. In one example, the probing apparatus according to the present disclosure may have a removable three-dimensional (3D) structure that could be easily applied to (or removed from) regions of interest (e.g., a back side) of the IC package, allowing to simultaneously create multiple electrical contacts on the CUT. Thus, with using an oscilloscope with multi-ports, one could simultaneously probe electrical signals generated across multiple power domains of the CUT.

The multiple power domains may include ones that supply the CUT (e.g., an IC) with power voltages such as core voltages, I/O interfaces voltage, standby voltages, and analog power voltages for phase-locked loop (PLL) and other functions, or the like. By way of example, for ICs used in a server system, there may be about 5 to 10 power domains of interest that should be monitored for each IC. The probing apparatus or method according to the present disclosure may provide parallel connection to multiple probing points of interest within the corresponding power domain to speed up the measurement process.

FIGS. 1A to 1F depict diagrams of an example probing apparatus according to an exemplary embodiment of the present disclosure.

Referring to three-dimensional (3D) examples depicted in FIGS. 1A and 1B, the probing apparatus 10 may include a carrier base 100 and one or more contact elements 200 (e.g., probes, probe heads) which are plugged into a bottom surface 120 (shown in FIG. 1B) of the carrier base 100. FIG. 1A depicts a top-view diagram of the probing apparatus 10 according to an exemplary embodiment of the present disclosure; and FIG. 1B depicts a bottom-view diagram of the probing apparatus 10 according to an exemplary embodiment of the present disclosure. FIG. 1C depicts an enlarged diagram of a portion A on a top surface 110 of FIG. 1A according to an exemplary embodiment of the present disclosure. FIG. 1D depicts an enlarged diagram of a portion B on the bottom surface 120 of FIG. 1B according to an exemplary embodiment of the present disclosure. FIG. 1F depicts an enlarged diagram of a portion C on the bottom surface 120 of FIG. 1B. FIG. 1E depicts a diagram of an example cylindrical ring conductor 1112 (e.g., friction finger) according to an exemplary embodiment of the present disclosure.

For example, as the example depicted in FIGS. 1A and 1B, the carrier base 100 may include a conducting portion and a non-conducting portion. The conducting portion of the carrier base 100 may include a plurality of conducting connectors 111 each extending in a vertical direction D1 from the bottom surface 120 of the carrier base 100 to the top surface 110 thereof. In some aspects, the plurality of conducting connectors 111 may be arranged in a matrix form on the top surface 110 of the carrier base 100. In the top-view diagrams of the carrier base 100 of FIGS. 1A and 1C, each conducting connector 111 may include a core conductor 1111 formed on a center thereof and a cylindrical ring element 1112 (e.g., friction finger) formed around the core conductor 1111. In some embodiments, the core conductor 111 and the cylindrical ring element 1112 may be formed of a conductive material (e.g., metal, copper), and/or may be electrically isolated from each other. The cylindrical ring element 1112 may function to retain the contact element 200 against detaching (or dislodging) from the carrier base 100 due to gravity, some minimal external force, or the like. Further, diagrams of the each conducting connector 111 in the bottom-view diagram of the carrier base 100 are depicted in FIGS. 1B and 1D-1F. The cylindrical ring element 1112 and the core conductor 1111 of FIG. 1C may extend in the manner as depicted in FIGS. 1D-1F. The cylindrical ring element 1112 (FIG. 1E) may be combined to a structure including the core conductor 1111 (FIG. 1D) to form the conducting connector 111 (FIG. 1F). The above-described features of the carrier base 100 may facilitate alignment and placement of the contact elements 200 and support the one or more contact elements 200.

Referring back to FIG. 1A, each of the contact elements 200 may be plugged into a corresponding one of the conducting connectors 111 of the carrier base 100. More detailed structures of the contact element 200 according to various embodiments of the present disclosure will be described with reference to FIGS. 2A-2C and 3A-3B.

Figure 2C:
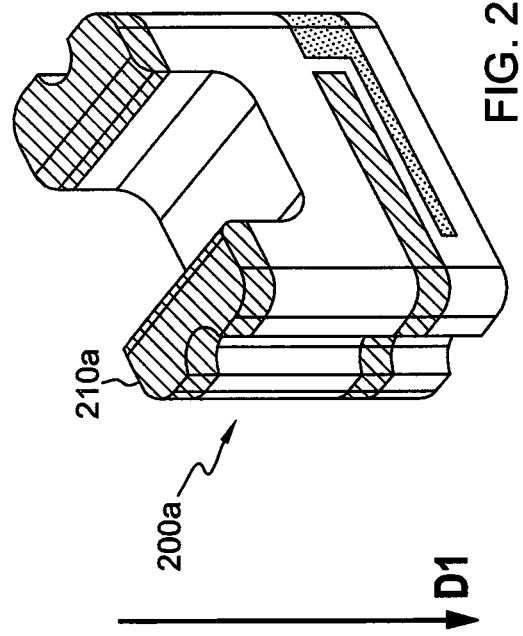
Figure 2A:
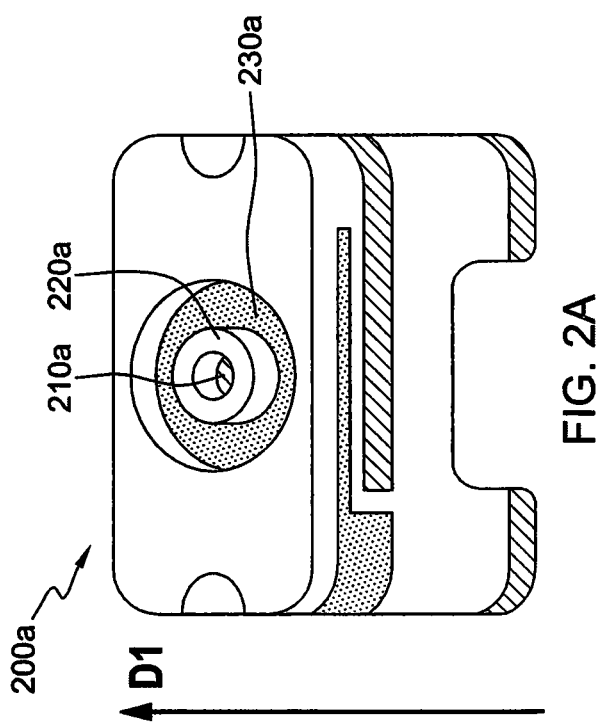

FIGS. 2A-2C depict various views of an example contact element 200a according to an exemplary embodiment of the present disclosure. FIG. 2A depicts a top-view diagram of the contact element 200a according to an exemplary embodiment of the present disclosure. FIG. 2B depicts a side-view diagram of the contact element 200a according to an exemplary embodiment of the present disclosure. FIG. 2C depicts a bottom-view diagram of the contact element 200a according to an exemplary embodiment of the present disclosure.

Referring to FIGS. 2A-2C, the contact element 200a has a top body portion and two opposing leg structures on either side. Also, the contact element 200a may include a power sense conductor 210a and a ground conductor 230a. The power sense conductor 210a and the ground conductor 230a may be formed of a conductive material (e.g., metal, copper). The remaining portions of the contact element 200a other than the power sense conductor 210a and the ground conductor 230a may be formed of a non-conductive material such as an insulating material.

In some embodiments, referring to FIGS. 2A-2C, the power sense conductor 210a and the ground conductor 230a may be formed inside and on each contact element 200a. In the top-view diagram depicted in FIG. 2A, a portion of the power sense conductor 210a is shown to be positioned inside a cylindrical ring element 220a on the top surface of the contact element 200a, and a portion of the ground conductor 230a is shown to be positioned outside the cylindrical ring element 220a. The cylindrical ring element 220a may be formed of a non-conductive material. For example, the power sense conductor 210a and the ground conductor 230a may be separated by the cylindrical ring element 220a, and thus electrically isolated from each other. By way of example, the power sense conductor 210a and the ground conductor 230a on the top surface of the contact element 200a (as depicted in FIG. 2A) are configured to be connected, respectively, to the core conductor 1111 and the cylindrical ring element 1112 on the bottom surface 120 of the carrier base 100 when the contact element 200a is plugged into the carrier base 100.

In some embodiments, each of the conducting connectors 111 may be formed using standard coaxial connectors (e.g., subminiature version A (SMA) connector) and/or may be connected to standard coaxial cables.

As depicted in FIGS. 2B and 2C, portions of the power sense conductor 210a may be formed on at least one side surface of the contact element 200a (FIG. 2B) and on the bottom surface (FIG. 2C), and other portions of the ground conductor 230a may be formed on at least one side surface of the contact element 200a.

In some embodiments, a portion of the contact element 200a is removed to form a cavity 250a which is open toward the bottom surface thereof (FIG. 2B) and define probe legs PL1 and PL2 on either side of the element. In some aspects, the cavity 250a may have a shape of an upside down U defined by the two probe legs PL1 and PL2 at opposing sides with respect to the cavity 250a. In performing the electrical signal measurements on electrical components (e.g., capacitors) of the CUT, the power sense conductor 210a formed on the bottom surface (e.g., underneath the probe legs PL1 and PL2) may contact (or land on) a corresponding probing point of the CUT to sense (or probe) the electrical signals flowing the electrical components of the CUT. In some aspects, the power sense conductor 210a may extend from one portion of the top surface of the contact element 200a to the bottom surface thereof via the probe legs PL1 and PL2. The electrical signals sensed through the power sense conductor 210a on the bottom surface of the contact element 200a may be transferred to the power sense conductor 210a of the top surface thereof. The top portion of each contact element 200a may be designed to mate with a corresponding conducting connector 111 of the carrier base 100. For example, the power sense conductor 210a and the ground conductor 230a of each contact element 200a correspond to the core conductor 1111 and the cylindrical ring element 1112, respectively, of each conducting connector 111 of the carrier base 100.

FIGS. 3A and 3B are various views of an example contact element 200b according to an exemplary embodiment of the present disclosure. FIG. 3A depicts a top-view diagram of the contact element 200b according to an exemplary embodiment of the present disclosure. FIG. 3B depicts a side-view diagram of the contact element 200b according to an exemplary embodiment of the present disclosure.

The contact element 200b of FIGS. 3A and 3B has substantially the same structure as the contact element 200a of FIGS. 2A-2C except that a cavity 250b of the contact element 200b has a different shape than the cavity 250a of the contact element 200a. Thus, duplicate descriptions thereof will be omitted for the sake of simplicity.

Referring to FIGS. 3A and 3B, the contact element 200b may extend in the vertical direction D1 from a bottom surface thereof to a top surface thereof. Also, the contact element 200b may include a power sense conductor 210b and a ground conductor 230b. The power sense conductor 210b and the ground conductor 230b may be formed of a conductive material (e.g., metal, copper). The remained portions of the contact element 200b other than the power sense conductor 210b and the ground conductor 230b may be formed of a non-conductive material.

Referring to the example depicted in FIG. 3B, the cavity 250b formed in the bottom surface of the contact element 200b may have under-cut areas (UCA) on respective corners of the upside down U-shape. In a practical CUT, some electrical components such as capacitors or other SMTs might not be flat after soldering. Such under-cut areas UCA may provide more space within the cavity 250b, so that the contact element 200b could land on the non-planar regions of the CUT without causing short-circuits. Shapes of cavities formed on bottom surfaces of contact elements are not limited to those illustrated in FIGS. 2B and 3B and may vary according to given testing environments. The top portion of each contact element 200b may be designed to mate with a corresponding conducting connector 111 of the carrier base 100. For example, the power sense conductor 210b and the ground conductor 230b of each contact element 200b correspond to the core conductor 1111 and the cylindrical ring element 1112, respectively, of each corresponding conducting connector 111 of the carrier base 100.

Various means may be employed to manufacture the contact element 200a or 200b. In some embodiments, the contact element 200a or 200b may be provided using a 3D printing technology where a conducting portion thereof is created using a curable conductive ink.

Figure 4:
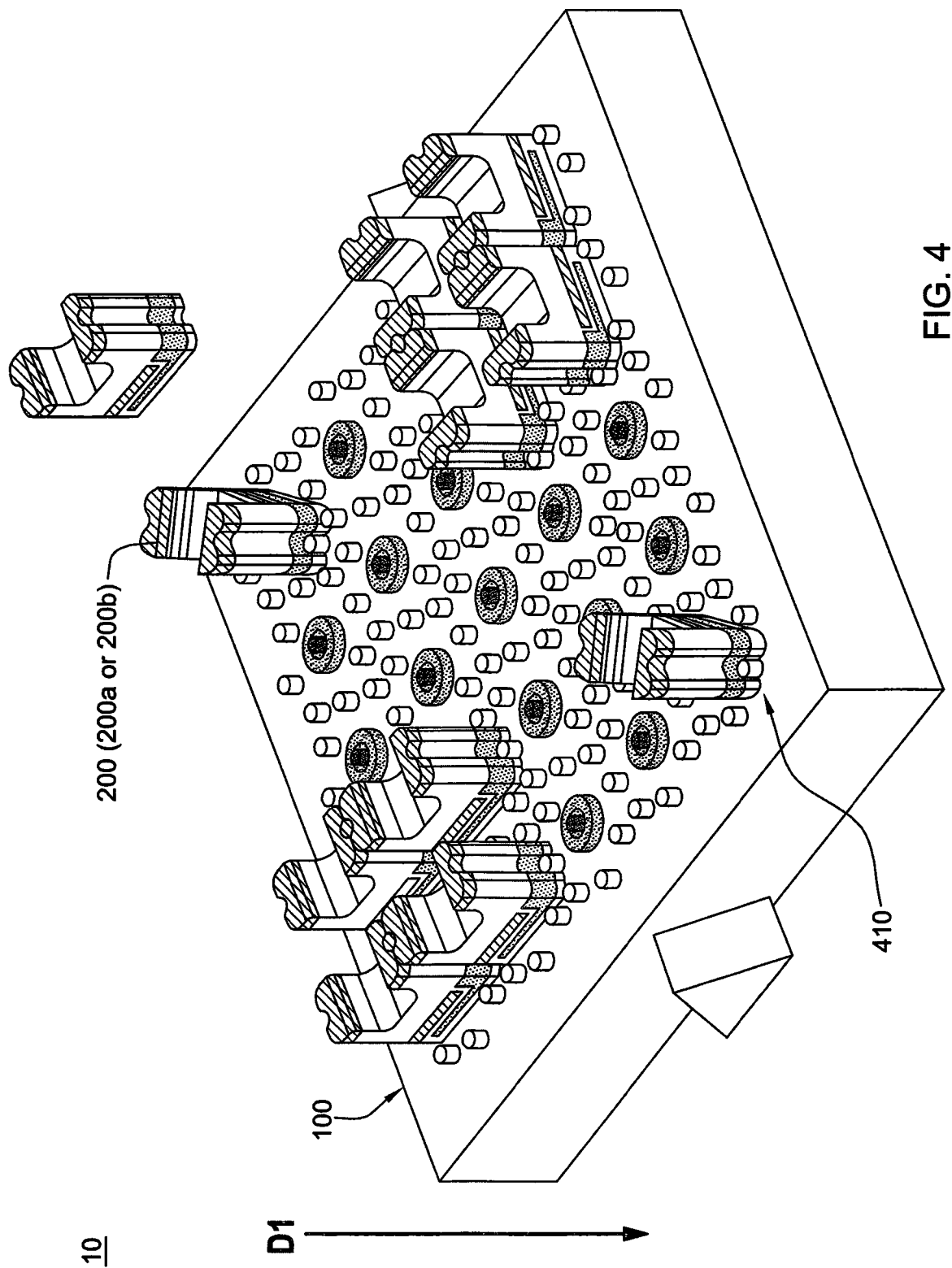
FIG. 4 depicts a diagram of an example probing apparatus of FIG. 1A where multiple contact elements are coupled to the carrier base according to an exemplary embodiment of the present disclosure.

FIG. 4 depicts a diagram of an example probing apparatus 10 of FIG. 1A where multiple contact elements 200 are coupled to the carrier base 100 according to an exemplary embodiment of the present disclosure.

Referring to FIG. 4, the contact elements 200 may easily be added to or removed from the carrier base 100 in a customizable manner. Thus, the carrier base 100 may capture or retain the one or more contact elements 200 whose orientations with respect to the carrier base 100 can be flexibly arranged to address specific testing application requirements. Particularly, features such that the carrier base 100 supports the multiple contact elements 200 may facilitate simultaneously creating electrical contacts corresponding to multiple points of the CUT. Thus, requirements of time and expertise for soldering and guaranteeing of a good contact can be removed. Using one or more measurement instruments (e.g., oscilloscope, protocol analyzer) with multiple monitoring ports may facilitate simultaneously monitoring electrical events generated in multiple power domains of the CUT.

Referring back to FIG. 2B, one or more side grooves 240a may be formed on at least one side surface of the contact element 200 (200a or 200b) to fix a direction where the contact element 200 (200a or 200b) is mechanically coupled (e.g., plugged in) to the carrier base 100. By way of example, as depicted in FIG. 4, the bottom surface 120 of the carrier base 100 includes a plurality of protrusions 410 which serve to guide (or fix) the contact elements 200 in an intended direction on the bottom surface 120 of the carrier base 100. For example, when the contact elements 200 are coupled to the carrier base 100, the respective side grooves 240a of the contact elements 200 may be caught by corresponding one(s) of the protrusions 410 to enable that the contact elements 200 are arranged and/or fixed in a certain direction.

In some embodiments, the respective contact elements 200 to be coupled to the carrier base 100 may have different lengths in the vertical direction D1, depending on testing environments, e.g., such as how probing points on the CUT are configured. For example, contact elements with relatively long lengths may be used to connect probing points without SMT parts on the CUT.

In some embodiments, when the contact elements 200 are coupled to the carrier base 100, directions where the contact elements 200 are placed may be flexibly determined with the protrusions 410 (as described with reference to FIG. 2B). By way of example, some of the contact elements 200 may be placed in parallel with either x-axis or y-axis of the carrier base 100; and others of the contact elements 200 may be placed at a 45 degree or similar to either the x-axis or y-axis of the carrier base 100.

Figure 5:
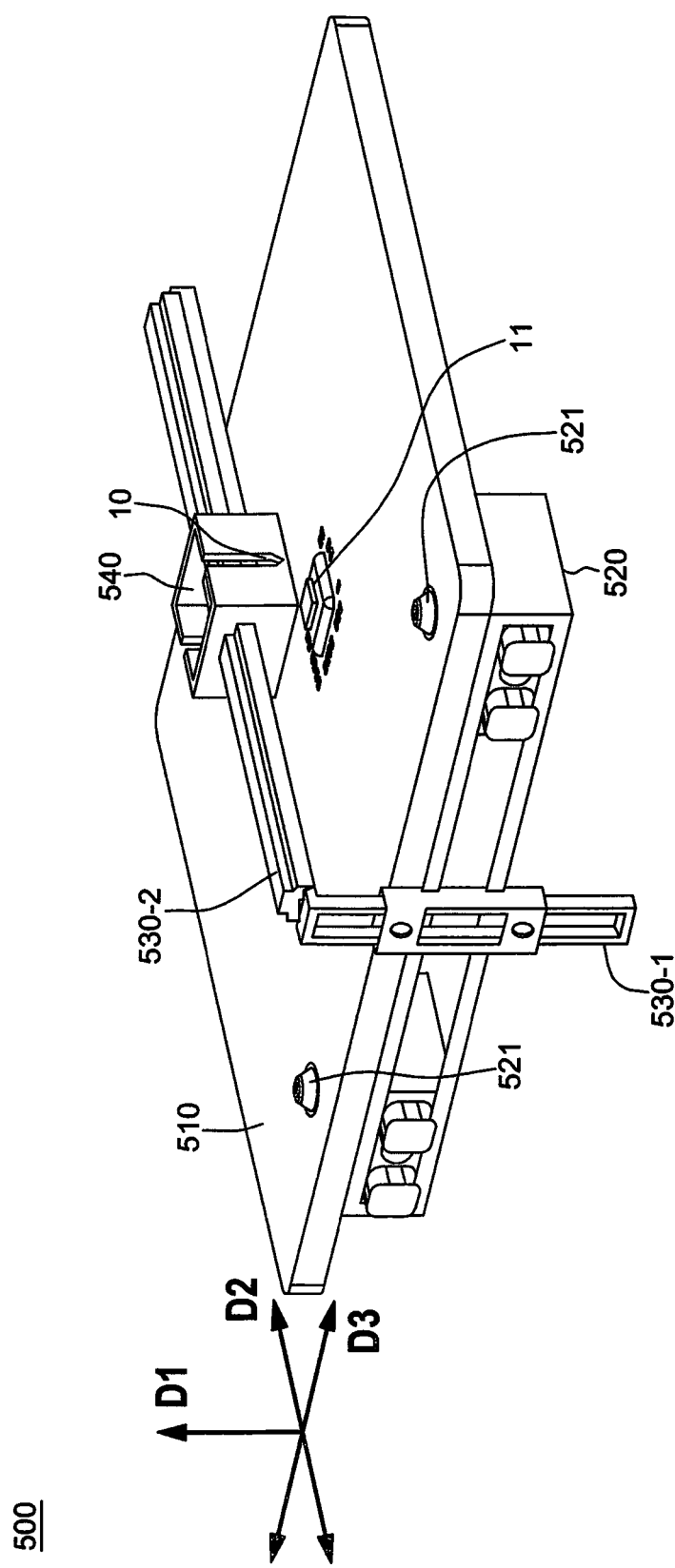
FIG. 5 is a diagram of an example locating assembly including a probing apparatus according to an exemplary embodiment of the present disclosure.

FIG. 5 is a diagram of an example locating assembly 500 including the probing apparatus 10 according to an exemplary embodiment of the present disclosure.

The locating assembly 500 may be provided to mechanically align, retain, and physically connect the contact elements 200 of the probing apparatus 10 to probing points (e.g., electrical components) of an IC 11 (e.g., CUT) disposed on a top board 510. For example, the top board 510 may be a card assembly under test in which CUTs including the IC 11 are mounted. Referring to the embodiments depicted in FIG. 5, the locating assembly 500 may include a mounting assembly 520, a moving arm assembly 530-1 and 530-2, and a supportive body 540 configured to mount the probing apparatus 10. The board 510 may be mounted on the mounting assembly 520. To this end, in some aspects, the mounting assembly 520 may have protrusions 521 to be inserted into holes formed in the board 510. The moving arm assembly 530-1 and 530-2 may have a cantilever shape (e.g., L-shape) whose one arm 530-1 is coupled to the mounting assembly 520 and another arm 530-2 extends in parallel with a top surface of the board 510. The another arm 530-2 (extending in parallel with the top surface of the card assembly 510) of the moving arm assembly may be configured to hold the supporting body 540. The moving arm assembly 530-1 and 530-2 may be configured to move along directions D2 and D3 in parallel with the top surface of the board 510 to facilitate monitoring or measuring of a variety of test locations on the board 510. Although not shown clearly in FIG. 5, the probing apparatus 10 may be mounted into the supportive body 540. For example, referring back to, e.g., FIG. 1A, a protrusion 112 of a (male) triangular shape may be formed on a side surface of the carrier base 100 may be coupled to a corresponding protrusion (not shown) of a, e.g., female complementary shape formed on the supportive body 540. In some embodiments, although not shown, a computer-implemented control unit may be used to control and drive operations of the locating assembly 500.

Figure 6:
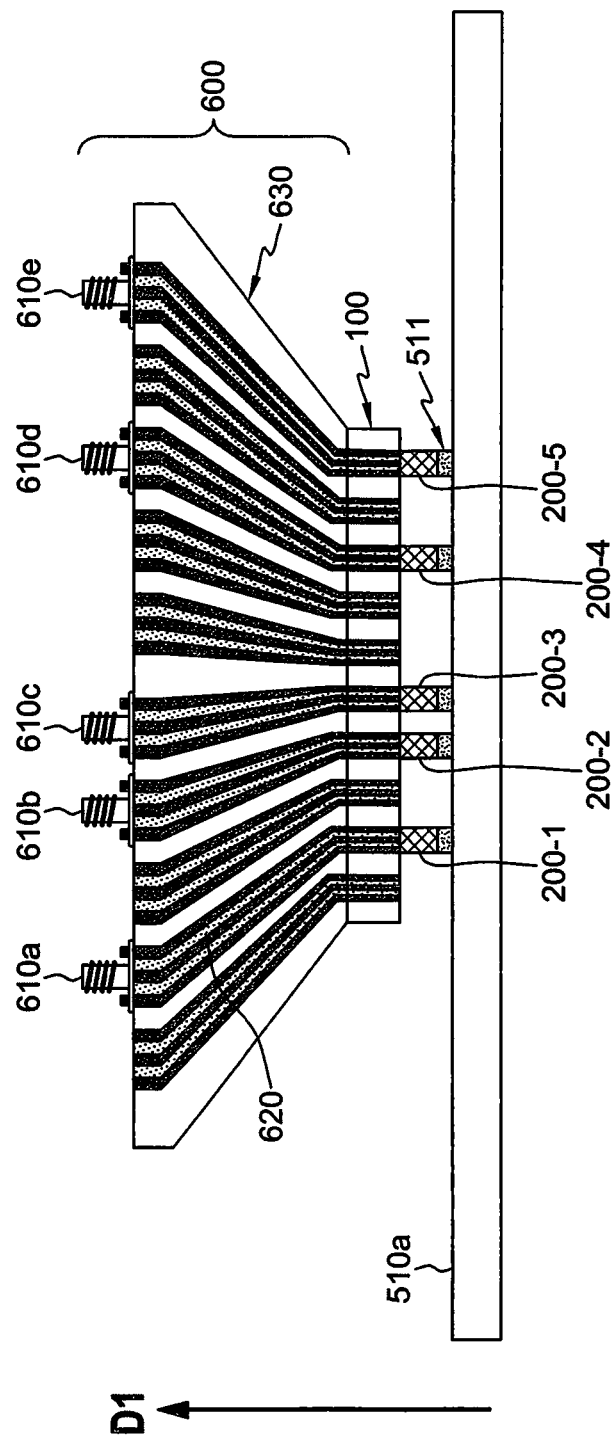
FIG. 6 depicts a side-view diagram of an example vertical fan-out assembly provided on a carrier base according to an exemplary embodiment of the present disclosure.

FIG. 6 depicts a front elevational view of an example vertical fan-out assembly 600 provided on a carrier base 100 according to an exemplary embodiment of the present disclosure. The vertical fan-out assembly 600 may be used to extend contacts of the connectors 111 of the carrier base 100 (see, e.g., FIG. 1A) to facilitate connecting signal wirings to measurement instruments (not shown). In some embodiments, an exterior of the vertical fan-out assembly 600 may have such a shape that a bottom surface thereof faces the top surface 110 of the carrier base 100 and a top surface thereof includes a plurality of standard coaxial connectors 610a to 610e (collectively referred to as "610") (e.g., SMA) which are suitable to be connected to the measurement instruments (not shown). The vertical fan-out assembly 600 may include a fan-out frame 630 and a plurality of printed conductors 620 (formed in the fan-out frame 630) extending to connect the contacts 111 of the carrier base 100 and the standard coaxial connectors 610a to 610e. For example, an area of the bottom surface of the fan-out frame 630 may be smaller than an area of the top surface thereof. The printed conductors 620 in the vertical fan-out assembly 600 may extend to maintain impedances and provide specified mating dimensions for the standard coaxial connectors 610a to 610e. Thus, as depicted in FIG. 6, the contact elements 200-1 to 200-5 may be connected to a corresponding one of the standard coaxial connectors 610a to 610e through the printed conductors 620 of the vertical fan-out assembly 600, and may contact electrical components 511 (e.g., SMT capacitors) of a top board 510a (e.g., card assembly under test) to sense electrical signals flowing through the electrical components 511. Thus, the electrical signals sensed at the electrical components 511 may be provided to the measurement instruments (not shown) through the fan-out assembly 600.

Figure 7A:
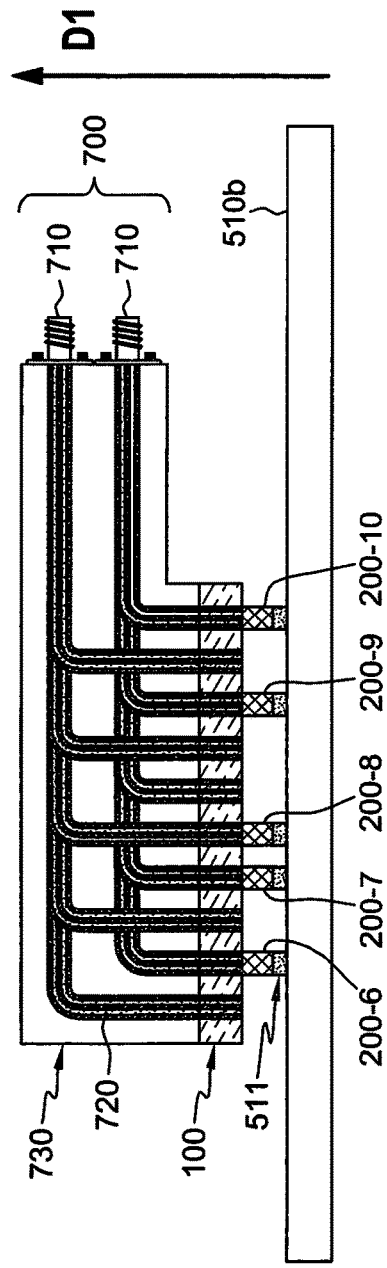
FIG. 7A depicts a side-view diagram illustrating an example horizontal fan-out assembly provided on a carrier base according to an exemplary embodiment of the present disclosure.

FIG. 7A depicts a front elevational view illustrating an example horizontal fan-out assembly 700 provided on a carrier base 100 according to an exemplary embodiment of the present disclosure.

In some embodiments, the horizontal fan-out assembly 700 may facilitate an orthogonal access of the probe apparatus 10 to a board 510b (e.g., card assembly under test). For example, the horizontal fan-out assembly 700 may be used to extend contacts of the connectors 111 of the carrier base 100 (see, e.g., FIG. 1A) to facilitate connecting signal wirings to measurement instruments (not shown). To this end, in some embodiments, the horizontal fan-out assembly 700 may include a fan-out frame 730 and a plurality of printed conductors 720 formed in the fan-out frame 730. The respective printed conductors 720 may have an L-shape whose one ends are connected to the top surface contacts 111 (FIG. 1A) of the carrier base 100 and another ends are connected to standard coaxial connectors 710a to 710e (FIG. 7B) (collectively referred to as "710" (FIG. 7A)). Such L-shape feature of the printed conductors 720 may facilitate testing a CUT (e.g., a card assembly) in a restrictive testing environment (e.g., such as inside system in a production rack) where there is not enough space above the card assembly under test, preventing the vertical fan-out assembly 600 of FIG. 6 for accessing the board 510a or 510b.

The printed conductors 720 in the horizontal fan-out assembly 700 may extend to maintain impedances and provide specified mating dimensions for the standard coaxial connectors 710a to 710e. Thus, as depicted in FIG. 7A, the contact elements 200-6 to 200-10 may be connected to a corresponding one of the standard coaxial connectors 710a to 710e through the printed conductors 720, and may contact electrical components 511 (e.g., SMT capacitors) of a card assembly 510b under test to sense electrical signals flowing through the electrical components 511. Thus, the electrical signals sensed at the electrical components 511 may be provided to the measurement instruments (not shown) through the horizontal fan-out assembly 700.

Figure 7B:
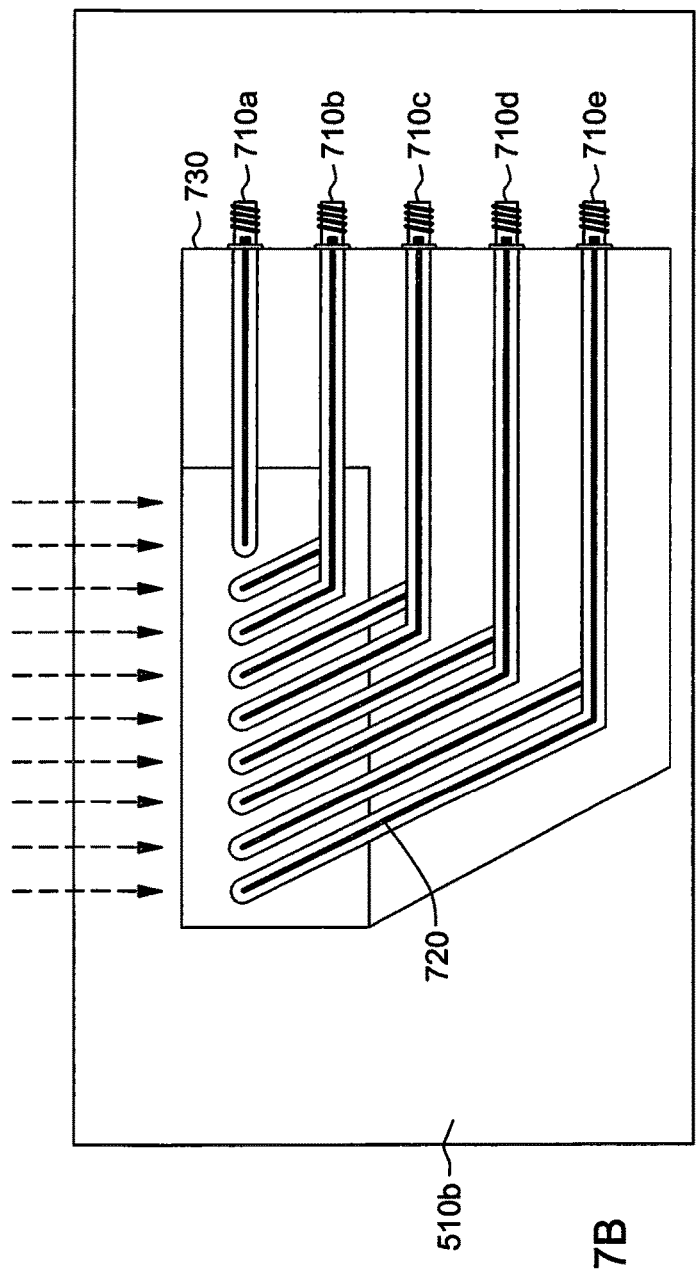
FIG. 7B is a top-view diagram illustrating the horizontal fan-out assembly of FIG. 7A according to an exemplary embodiment of the present disclosure.

FIG. 7B depicts an example top-view diagram of the fan-out assembly 700 of FIG. 7A according to an exemplary embodiment of the present disclosure. Shown are the printed conductors 720 and the standard coaxial connectors 710a to 710e in the fan-out assembly 700, as exemplarily depicted in FIG. 7B. Referring to the examples depicted in FIGS. 7A and 7B, each of the contact elements 200-6 to 200-10 (FIG. 7A) are connected to a corresponding one of the printed conductors 720 (FIG. 7B). The array format of the standard coaxial connectors 710 may be modified according to a variety of measurement situations such as restricted access card slots, etc, allowing accommodating "full plan of record (POR)" mechanism structure without altering a configuration of a product level card assembly under test (e.g., 510, 510a or 510b), thus enabling simultaneous test probing on multiple card assemblies within a given cage structure.

Figure 8A:
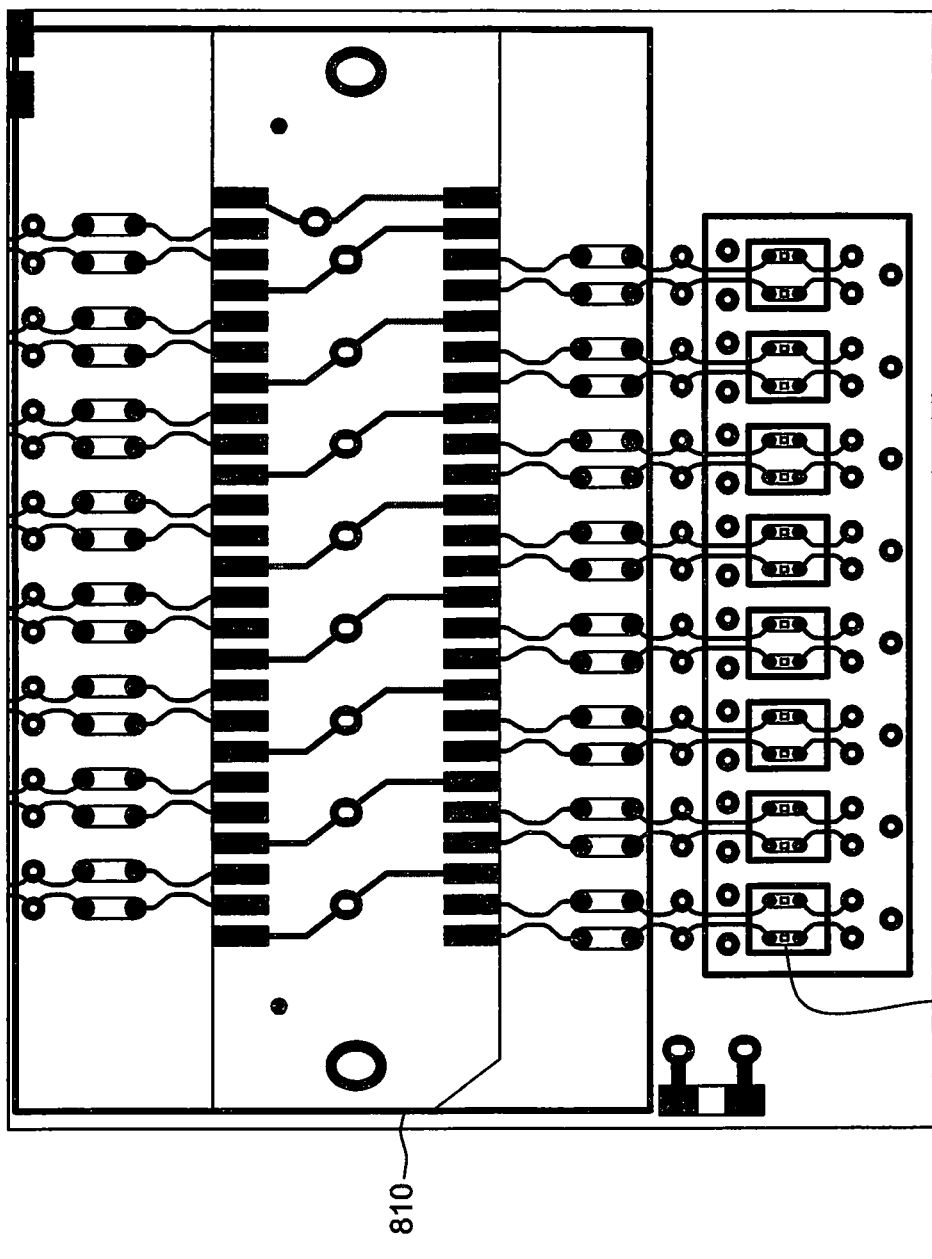
FIG. 8A depicts a circuit layout of an example high-speed link circuit board.

FIG. 8A depicts a circuit layout of an example high-speed link circuit board 800 to be tested using the probing apparatus 10. In debugging the high-speed link circuit board 800, measurement instruments (not shown) may be connected to high-speed probing points (not shown) on the circuit board 800; in this case, the measurement instruments need to be isolated from the signaling points by one or more resistive elements to isolate the functional signals flowing therearound. Without the isolating resistors an additional circuit load (the instruments) deteriorates the intended signal. By way of example depicted in FIG. 8A, the high-speed probing points are shown as respective nodes of a plurality of capacitors 815, and a resistive element 810 for isolation is shown in FIG. 8A; for example, the measurement instruments may be connected to the plurality of capacitors 815 through the circuitry 810. In this case, when the instrument is disconnected from the circuit board 800, the circuitry 810 may remain to occupy a considerable amount space on the circuit board 800, also leaving electrical "stubs", which may be undesirable for high frequency signal propagation. In one embodiment, a method or apparatus where the circuitry 810 serving as addition resistive element can be removed while retaining the debug capability, as will be hereinafter described in more detail with reference to FIGS. 8B-8D.

Figure 8B:
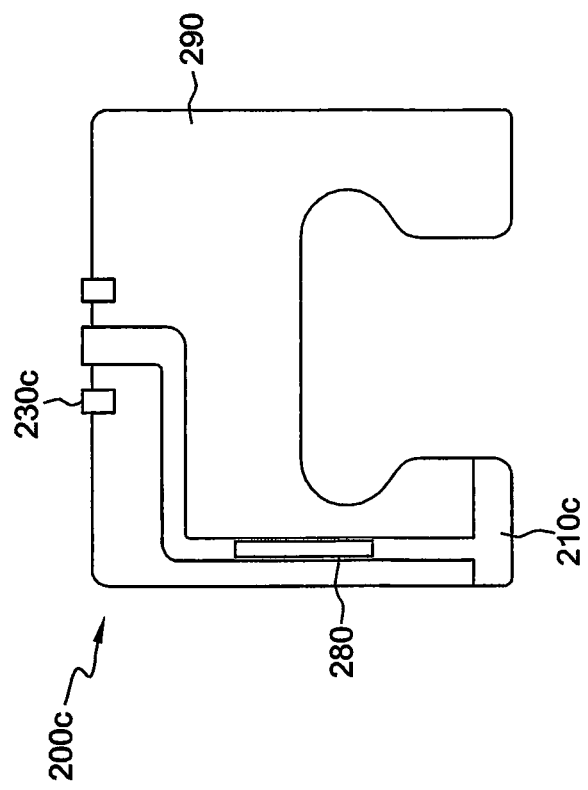
FIG. 8B depicts a diagram of an example resistive contact element according to an exemplary embodiment of the present disclosure.

FIG. 8B depicts a diagram of an example resistive contact element 200c according to an exemplary embodiment of the present disclosure. As depicted in FIG. 8B, the resistive contact element 200c may have a structure where a sensing conductor (referred to as a power sense conductor in previous embodiments) 210c is formed in one of two probe legs thereof and no sensing conductor 210c is formed in another of the two probe legs. For example, a resistive element 280 with impedance of, e.g., 220 ohm, may be formed within the sensing conductor 210c and serve as a resistive element to prevent the distributed electromagnetic effects. Thus, if the respective resistive contact elements 200c directly contact corresponding nodes of the capacitors 815 to sense high-speed signals flowing through the capacitors 815, the redundant resistive circuitry 810 shown in FIG. 8A may be unnecessary because of the resistive element 280 formed in the sensing conductor 210c. The element 290 may be formed of non-conducting materials. By way of example, a ground conductor 230c may be formed around the sensing conductor 210c on a top surface of the resistive contact element 200c. However, the configuration depicted in FIG. 8B is a non-limiting example. For example, a ground conductor of the resistive contact element 200c may be formed using substantially the same structure as that of the ground conductor 230a of FIG. 2A and the ground conductor 230b of FIG. 3A. In a further example, the structure or location of the ground conductor of the resistive contact element 200c may be designed in a variety of ways, so that the ground conductor touches down on ground reference pads with predetermined locations (e.g., around capacitors 815) on the circuit board 800.

In addition, although it is illustrated that the resistive contact element 200c has a probe leg structure with undercuts as does the contact element 200b of FIG. 3A, exemplary embodiments of the present disclosure are not limited thereto. For example, the resistive contact element 200c has a similar probe leg structure to that of the contact element 200a of FIG. 2A.

Figure 8C:
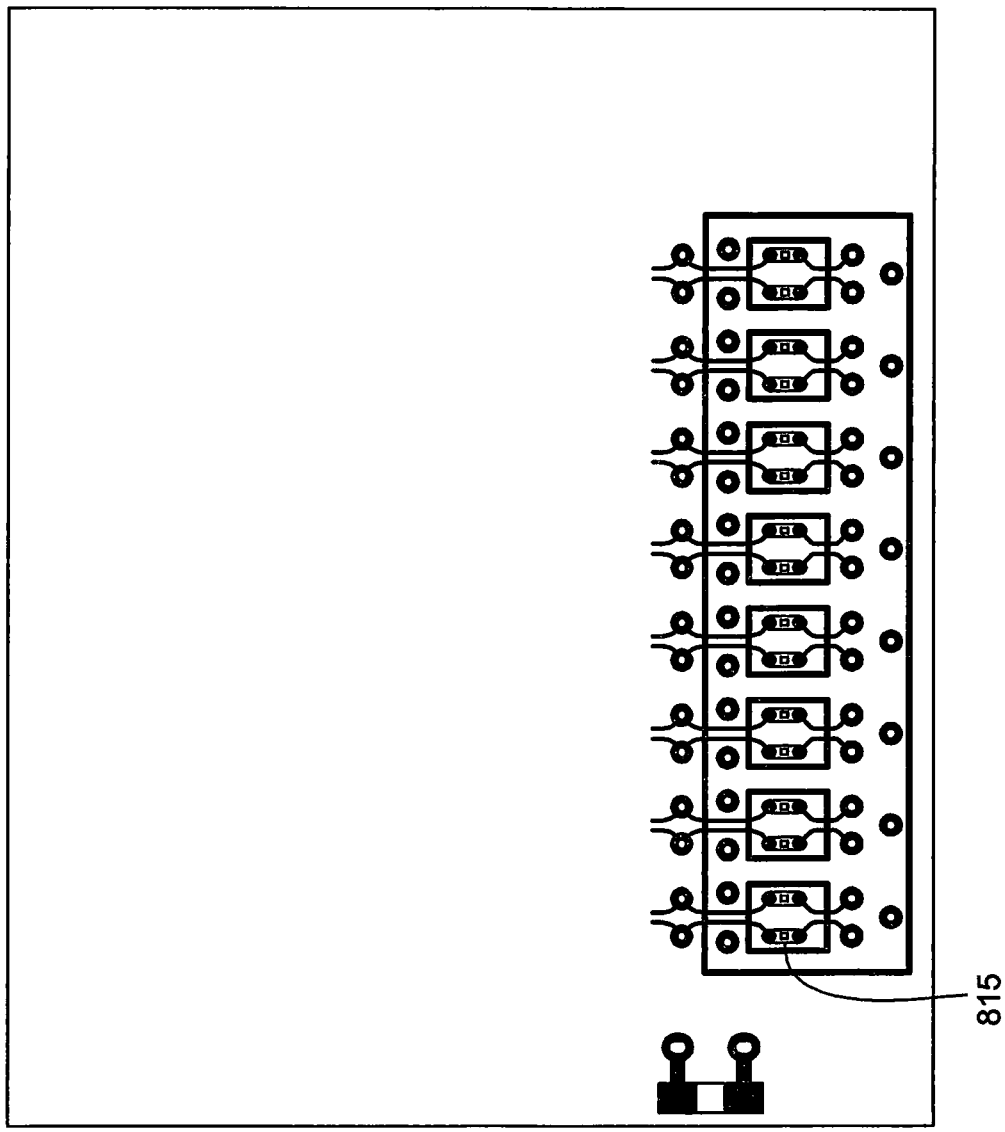
FIG. 8C depicts a circuit layout of an example high-speed link circuit board according to an exemplary embodiment of the present disclosure.

For example, FIG. 8C depicts a circuit diagram of an example high-speed link circuit board 800a according to an exemplary embodiment of the present disclosure. Since using the resistive contact element 200c having the resistive element 280 allows proving signals directly from the capacitors 815, the high-speed link circuit board 800a of FIG. 8C does not have additional resistive elements thereon such as the resistive circuitry 810 of FIG. 8A.

Figure 8D:
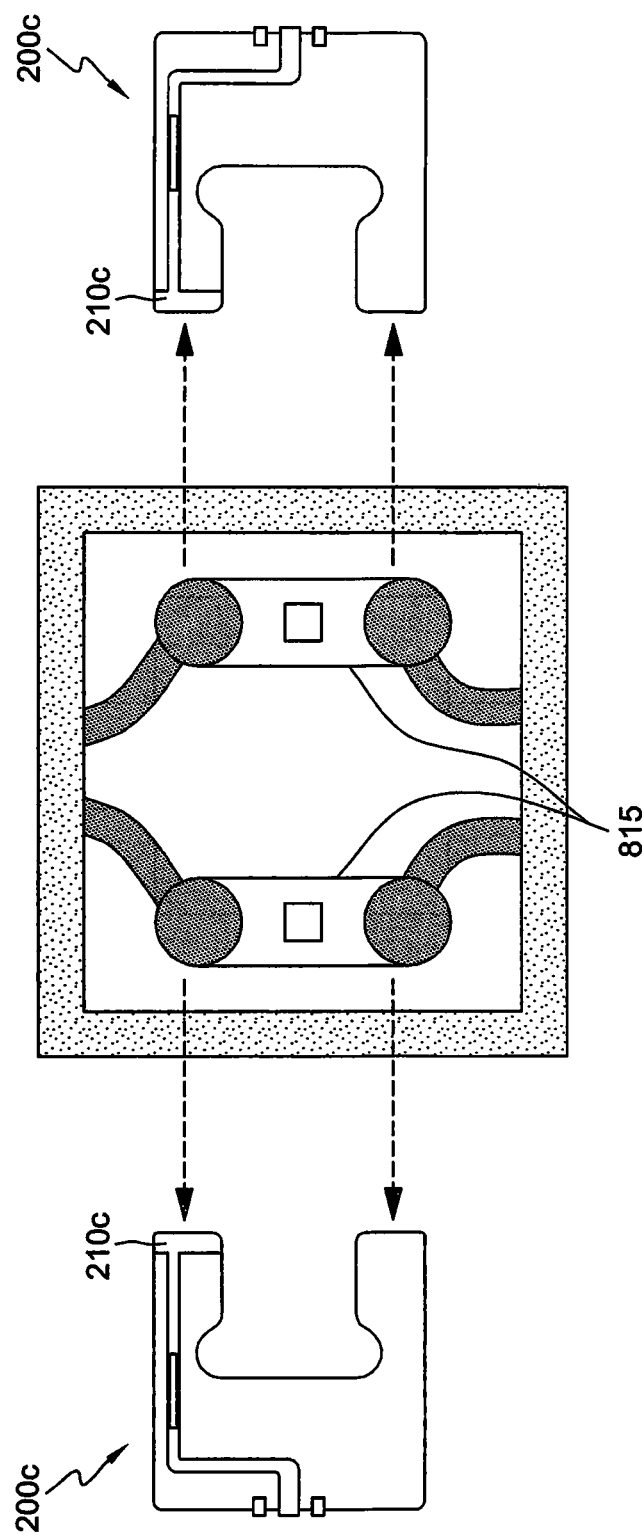
FIG. 8D is a diagram illustrating how a resistive contact element is connected to capacitors according to an exemplary embodiment of the present disclosure.

FIG. 8D is a diagram illustrating how the resistive contact element 200c is connected to the capacitors 815 according to an exemplary embodiment of the present disclosure. As seen in FIG. 8D, a pair of capacitors 815 among the plurality of capacitors is illustrated. Each of the capacitors 815 may pass a high-speed signal (e.g., AC component), subject to be probed in debugging a high-speed circuit board (e.g., 800a), as a result, two nodes of each capacitor 815 have substantially the same high-speed signal as each other. Thus, as depicted in FIG. 8D, a conducting leg in which the sensing conductor 210c is formed may be connected to one node of the corresponding capacitor 815. In some aspects, another leg (e.g., non-conducting leg) where no sensing conductor 210c is formed may touch down on the other node of the capacitor 815 to be mechanically supported. For each capacitor 815, one resistive contact element 200c is required. Although not shown in FIGS. 8B-8D, the resistive contact elements 200c may be plugged into the carrier base 100 in a customized way according to spacing between the capacitors 815. In some embodiments, a PCB layout of the capacitors 815 may also be designed to mate with this version of the customized carrier base 100.

Figure 9:
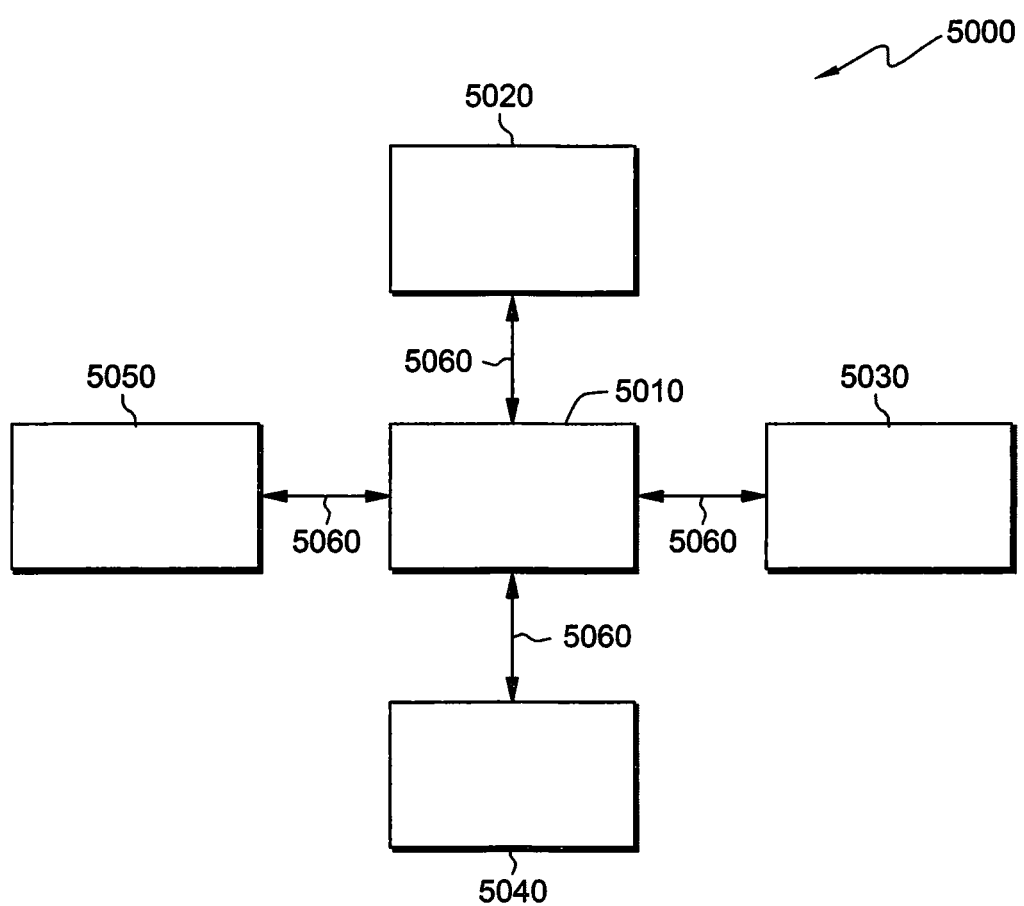
FIG. 9 is a block diagram of a computing system according to an exemplary embodiment of the present invention.

FIG. 9 is a block diagram of a computing system 5000 according to an exemplary embodiment of the present disclosure.

Referring to FIG. 9, the computing system 5000 may be used as a platform for performing (or controlling) the functions or operations described hereinabove with respect to the locating assembly 500 of FIG. 5.

In addition, the computing system 5000 may be implemented with an UMPC, a net-book, a PDA, a portable computer (PC), a web tablet, a wireless phone, a mobile phone, a smart phone, an e-book, a PMP, a portable game console, a navigation device, a black box, a digital camera, a DMB player, a digital audio recorder, a digital audio player, a digital picture recorder, a digital picture player, a digital video recorder, a digital video player, or the like.

Referring to FIG. 9, the computing system 5000 may include a processor 5010, I/O devices 5020, a memory system 5030, a display device 5040, and a network adaptor 5050.

The processor 5010 may drive the I/O devices 5020, the memory system 5030, the display device 5040, and the network adaptor 5050 through a bus 5060.

The computing system 5000 may include a program module (not shown) for performing (or controlling) the functions or operations described hereinabove with respect to the locating assembly 500 of FIG. 5 according to exemplary embodiments. For example, the program module may include routines, programs, objects, components, logic, data structures, or the like, for performing particular tasks or implement particular abstract data types. The processor (e.g., 5010) of the computing system 5000 may execute instructions written in the program module to perform (or control) the functions or operations described hereinabove with respect to the locating assembly 500 of FIG. 5. The program module may be programmed into the integrated circuits of the processor (e.g., 5010). In an exemplary embodiment, the program module may be stored in the memory system (e.g., 5030) or in a remote computer system storage media.

The computing system 5000 may include a variety of computing system readable media. Such media may be any available media that is accessible by the computer system (e.g., 5000), and it may include both volatile and non-volatile media, removable and non-removable media.

The memory system (e.g., 5030) can include computer system readable media in the form of volatile memory, such as random access memory (RAM) and/or cache memory or others. The computer system (e.g., 5000) may further include other removable/non-removable, volatile/non-volatile computer system storage media.

The computer system (e.g., 5000) can communicate with one or more devices using the network adapter (e.g., 5050). The network adapter may support wired communications based on Internet, LAN, WAN, or the like, or wireless communications based on CDMA, GSM, wideband CDMA, CDMA-2000, TDMA, LTE, wireless LAN, Bluetooth, or the like.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++ or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description, but is not intended to be exhaustive or limited to the present disclosure in the form disclosed. Many modifications and variations will be apparent to those of ordinary skill in the art without departing from the scope and spirit of the present disclosure. The embodiment was chosen and described in order to best explain the principles of the present disclosure and the practical application, and to enable others of ordinary skill in the art to understand the present disclosure for various embodiments with various modifications as are suited to the particular use contemplated.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An apparatus, comprising:
   a carrier base; and
   one or more contact elements coupled to a portion of the carrier base, the one or more contact elements each having a non-conducting top body portion defining a continuous top surface and two legs extending from said top body portion on opposing sides thereof defining a cavity under the top body portion, the contact elements are configured to sense an electrical signal flowing through at least one electrical component in a circuitry under test;
   wherein a first contact element of the one or more contact elements comprises:
   a power sense conductor extending from a bottom surface of the first contact element toward a top surface of the first contact element; and
   a ground conductor electrically isolated from the power sense conductor, wherein both the ground conductor and power sense conductor include portions exposed at the continuous top surface for coupling with a corresponding contact at a surface of said carrier base.

2. The apparatus of claim 1, wherein the ground conductor extends from at least one side surface of the first contact element to another portion of the top surface thereof.

3. The apparatus of claim 1, wherein a side groove is formed on at least one side surface of the first contact element, extending from the bottom surface of the first contact element toward the top surface of the first contact element, said groove for mating with a complementary protruding element provided on the carrier base.

4. The apparatus of claim 1, wherein the cavity has an upside down U-shape.

5. The apparatus of claim 1, wherein the cavity has an upside down U-shape in which an under cut is formed on at least one of corners of the U-shape.

6. The apparatus of claim 1, wherein the power sense conductor is formed in each of the at least two legs of the first contact element.

7. The apparatus of claim 1, wherein the power sense conductor is formed in one of the at least two legs of the first contact element and is not formed on others of the at least two legs.

8. The apparatus of claim 7, wherein a resistive element is formed in the power sense conductor.

9. The apparatus of claim 1, wherein a bottom surface of the carrier base has one or more protrusions, the first contact element is coupled to the bottom surface of the carrier base in a direction guided by at least one of the one or more protrusions.

10. The apparatus of claim 1, wherein a portion of the ground conductor extends from a side surface of said top body portion through said top body portion for exposure at the top surface, and a portion of the power sense conductor extends from the side surface of said top body portion through said top body portion for exposure at the top surface.

* * * * *